United States Patent [19]

Sahara et al.

[11] 4,385,320

[45] May 24, 1983

[54] AUTOMATIC FREQUENCY CONTROL CIRCUIT

[75] Inventors: Hiroshi Sahara, Yokohama; Shuji Ishikawa, Sagamihara; Fumikazu Otsuka, Tokyo, all of Japan

[73] Assignee: Sony Corporation, Tokyo, Japan

[21] Appl. No.: 277,738

[22] Filed: Jun. 26, 1981

[30] Foreign Application Priority Data

Jul. 2, 1980 [JP] Japan .................................. 55-90184

[51] Int. Cl.³ .............................................. H04N 5/04
[52] U.S. Cl. ....................................... 358/159; 331/20
[58] Field of Search ........................... 358/159; 331/20

[56] References Cited

U.S. PATENT DOCUMENTS 3,764,744 10/1973 Van Hattum et al. ............... 358/159

Primary Examiner—Richard Murray
Attorney, Agent, or Firm—Lewis H. Eslinger; Alvin Sinderbrand

[57] ABSTRACT

An automatic frequency control (AFC) circuit is disclosed which comprises an oscillating circuit for generating repetitive pulses, a generator for generating comparison signals having a slope portion in response to the repetitive pulses, and a phase comparison circuit which compares the comparison signals, and synchronous (sync) signals and based on the comparison supplies control signals to the oscillating circuit. The AFC circuit further comprises a limiting circuit connected between the comparison signal generator and the phase comparison circuit which limits the maximum and minimum levels of the comparison signals to predetermined levels, and thereby predeterminedly limits the control range of the AFC circuit.

4 Claims, 12 Drawing Figures

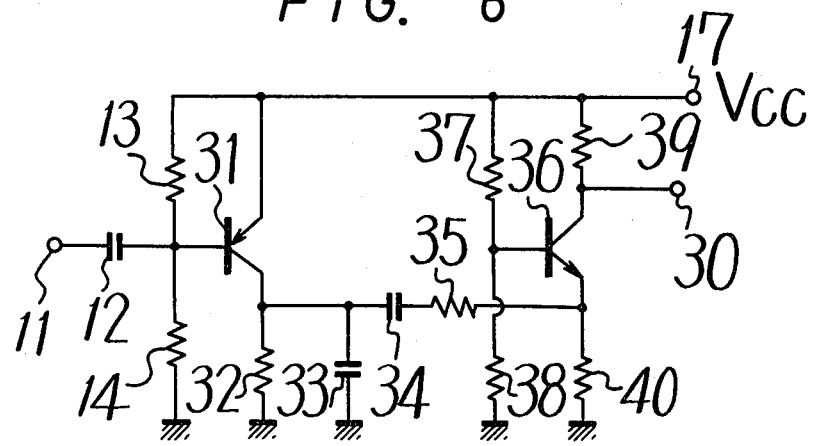
FIG. 6
FIG. 7A
FIG. 7B
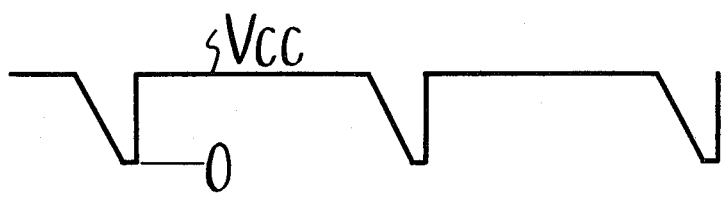

AUTOMATIC FREQUENCY CONTROL CIRCUIT

BACKGROUND OF THE INVENTION

1. Field of the Invention

The present invention relates generally to an automatic frequency control (AFC) circuit and more particularly to an AFC circuit, preferably is used in a television receiver, which has a predeterminedly limited control range.

2. Description of the Prior Art

In a prior art horizontal AFC circuit of a television receiver, as shown in FIG. 1, the output from a horizontal oscillator 1 which can be, for example, a control pulse is supplied to a horizontal output circuit 2 and a flyback pulse therefrom is fed to a saw-tooth wave generator 3. Though not shown, the horizontal output circuit 2 comprises a deflection circuit and a high voltage generating circuit. The saw-tooth wave signal from saw-tooth wave generator 3 is supplied, as a comparison signal, to a phase comparator 4 which is also supplied with a horizontal synchronizing (sync) signal H through a terminal 5. In phase comparator 4 the saw-tooth wave signal is compared with the horizontal sync signal H to detect the phase difference between the saw-tooth wave signal and the horizontal sync signal. The detected phase difference is applied to horizontal oscillator 1 as an AFC voltage $e_c$. As shown in FIG. 2, when the horizontal sync signal H is coincident with the center $\phi_0$ of the downward sloping portions of the comparison signal, that is, when the phase difference between the comparison and sync signals is 0 (zero), the synchronization is maintained for phase differences of which corresponds to the ends of the downward sloping portion of the comparison signal. For phase differences of $\pm\phi_{cm}$, the AFC output voltage $e_c$ has a maximum value of $\pm e_{cm}$.

If the AFC control sensitivity is taken as $\beta$, the maximum frequency range within which the $f_{cm}$ oscillating frequencies are controlled, hereinafter referred to as the control range, is:

$$f_{cm} = \pm 2\pi \beta e_{cm}$$

When the value of $e_{cm}$ in the above formula is need constant, regardless of frequency variation, then the value of $f_{cm}$ is constant.

Generally, the comparison signal, which is supplied by saw-tooth wave generator 3, is provided by integrating the flyback pulse. Both the width of the flyback pulse, which is determined by an LC resonance of horizontal output circuit, and the inclination of the rising portion of the comparison signal, which is determined by an RC time constant of the sawtooth generator, are constant. Therefore, the value of $e_{cm}$ varies with the frequency resulting in a variable value of $f_{cm}$.

For example, as shown throughout FIGS. 3A, 3B, and 3C, both the width of the downward sloping portion and the inclination of the rising portion of the comparison signals are constant. As a result, when the frequency becomes high (FIG. 3A) as compared with its reference state (FIG. 3B), the value of $e_{cm}$ becomes small as represented by $e'_{cm}$ and when the frequency becomes low (FIG. 3C) as compared with the reference state (FIG. 3B), the value of $e_{cm}$ becomes large as represented by $e''_{cm}$.

Therefore, when the frequency of the horizontal output signal is high, the differences between the minimum and maximum control signal amplitudes, hereinafter referred to as the amplitude range become smaller resulting in a reduced control range $f_{cm}$. In contrast thereto, when the frequency of the horizontal oscillator signal is low, the amplitude range becomes larger resulting in an increase of control range $f_{cm}$.

Typically for a variable control range as described heretofore, the AFC circuit is designed with the smaller control range, corresponding to high oscillating frequencies, as a reference. Such a reference, however, results in the control range at lower oscillating frequencies becoming either too large or at least larger than necessary.

When the control range at the lower oscillating frequencies is too large, the amplitudes of the control signals, that is, the values of $\pm e_{cm}$, are too high or low to be applied to horizontal oscillator 1 and thereby results in an unacceptable frequency correction. Such unacceptably high or low values of $e_{cm}$ can occur, for example, when the sync signal disappears during switching of television channels resulting in the oscillating frequency becoming too low and thereby creating a voltage in the horizontal output circuit that is abnormally high. Therefore, it is necessary that the control range of the AFC circuit be made as small as possible for lower frequencies.

Further, if the control range is too large, the AFC circuitry may unnecessarily adjust the oscillating frequency when noise is present on a weakly received signal.

Accordingly, an AFC circuit should necessarily have as small a control range as possible. Such a small control range is possible by providing maximum and minimum values of $e_{cm}$ irrespective of frequency variation.

OBJECTS AND SUMMARY OF THE INVENTION

Accordingly, it is an object of the present invention to provide an AFC circuit which avoids the drawbacks of the prior art.

More specifically, it is an object of the present invention to provide a new and improved AFC circuit whose control range is constant.

It is another object of the present invention to provide a new and improved AFC circuit which limits the maximum and minimum values of the amplitude range.

According to an aspect of the present invention, an AFC circuit comprises:

an oscillating circuit for generating repetitive pulses;

means for receiving said repetitive pulses and generating comparison signals having a slope portion and maximum and minimum levels in response to said repetitive pulses, said generating means having an output terminal;

a source of reference signals;

phase comparison means having a first input terminal supplied with said comparison signals, a second input terminal supplied with said reference signals and an output terminal for supplying said automatic frequency control signal to said oscillating circuit for controlling its frequency within a control range; and limiting means connected between said comparison signal generating means and said phase comparison means for limiting said maximum level and said minimum level of said comparison signals to first and second predetermined levels respectively, thereby limiting said control range of said automatic frequency control signal generating circuit to a predetermined range.

The above, and other objects, features and advantages of the present invention will become apparent from the following description which is to be read in conjunction with the accompanying drawings, in which like reference numerals designate like elements and parts.

BRIEF DESCRIPTION OF THE DRAWINGS

FIG. 6 is an alternative embodiment of circuitry which replaces the circuitry of FIG. 4 and produces a comparison signal in accordance with the present invention; and FIGS. 7A and 7B illustrate respectively an input waveform supplied to and an output waveform produced by the circuitry shown in FIG. 6.

DESCRIPTION OF THE PREFERRED EMBODIMENTS

The present invention will be hereinafter described with reference to the attached drawings.

Figure 1:
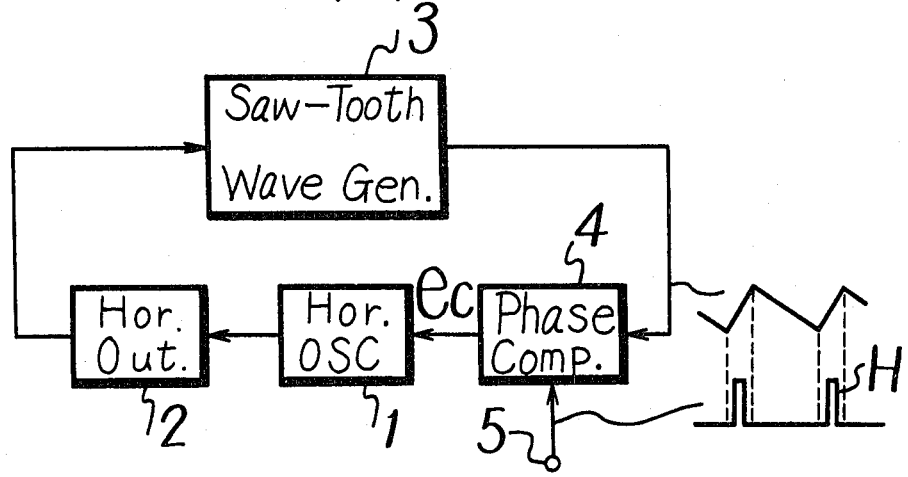
FIG. 1 is a block diagram showing a prior art AFC circuit.
Figure 2:
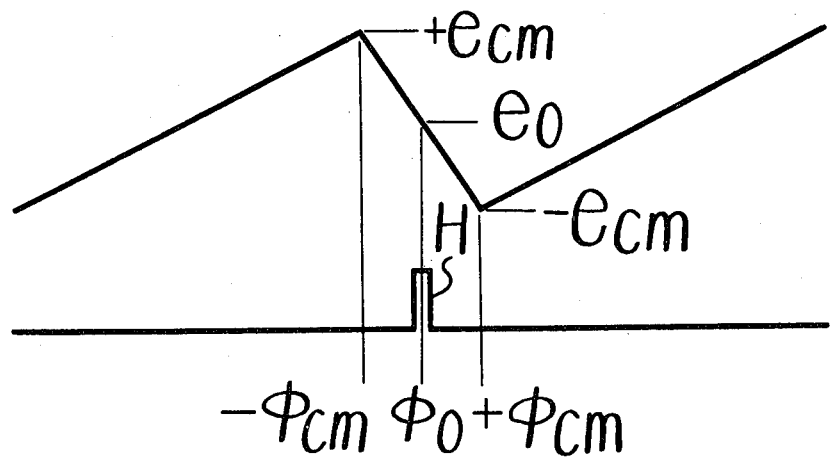
FIG. 2 and FIGS. 3A to 3C are waveform diagrams used to explain the operation of the prior art circuit shown in FIG. 1.
Figure 3A:
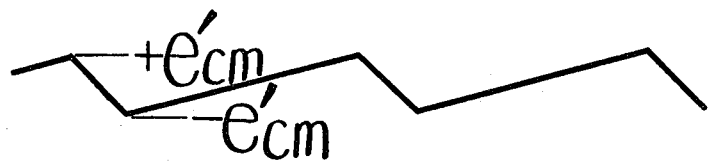
Figure 3B:
Figure 3C:
Figure 4:
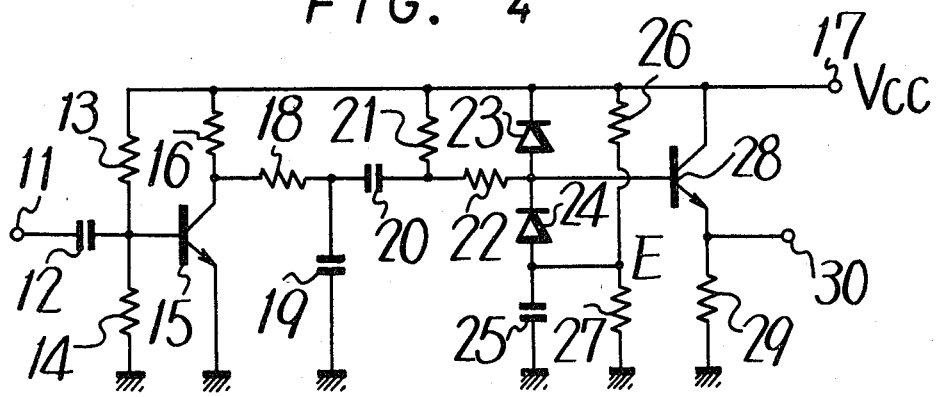
FIG. 4 is an embodiment of saw-tooth wave generating and limiter circuitry in accordance with the present invention.

FIG. 4 includes an input terminal 11 connected to horizontal output circuit 2 (not shown) and an input capacitor 12. Input capacitor 12 is connected to resistors 13 and 14. Capacitor 12 and resistors 13 and 14 form a bias circuit which biases a base of an NPN-type transistor 15. Transistor 15 has a grounded emitter and a collector connected through a resistor 16 to a power supply terminal 17 which is at a voltage $V_{cc}$ and through a series connection of a resistor 18 and a capacitor 19 to ground. The connection point between resistor 18 and capacitor 19 is connected to power supply terminal 17 through a series connection of a capacitor 20 and a resistor 21. The connection point of capacitor 20 and resistor 21 is connected to power supply terminal 17 through a resistor 22 and a diode 23 wherein the cathode and anode of diode 23 are respectively connected to terminal 17 and resistor 22. The connection point of capacitor 20 and resistor 21 is also connected to ground through resistor 22 and a series connection of a diode 24 and a capacitor 25 which is grounded wherein the cathode and anode of diode 24 are respectively connected to the connection point of resistor 22 and diode 23 and to capacitor 25. The connection point of diode 24 and capacitor 25 is connected to the connection point of voltage dividing resistors 26 and 27. Resistors 26 and 27 are connected between terminal 17 and ground. The connection point between diodes 23 and 24 is connected to a base of an NPN-type transistor 28 whose collector is connected to power supply terminal 17 and whose emitter is grounded through a resistor 29 and connected to an output terminal 30. Output terminal 30 is connected to an input terminal of phase comparator 4 (not shown).

Diodes 23 and 24 form a limiter circuit and capacitor 25 and resistors 26 and 27 form a direct current (d.c.) voltage source having a voltage level of E.

Figure 5A:
FIGS. 5A, 5B, and 5C illustrate respectively input and output waveforms of the saw-tooth wave generator and the output waveform of the limiter shown in FIG. 4.
Figure 5B:
Figure 5C:
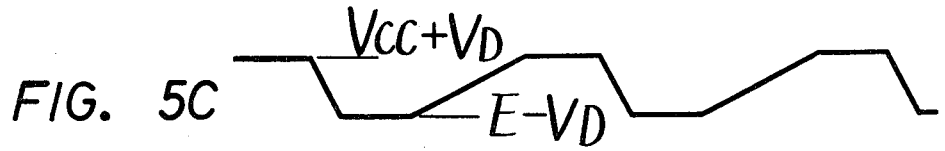

When a repetitive pulse, such as a flyback pulse, as shown in FIG. 5A, is applied to input terminal 11, a saw-tooth wave (FIG. 5B) is generated at the connection point of capacitor 20 and resistor 22 which in turn is fed to the limiter circuit which produces a waveform as shown in FIG. 5C. That is, the value $e_{cm}$ is limited to an upper level $V_{cc}+V_D$ and a lower level $E-V_D$ (where $V_D$ is the forward voltage drop of diodes 23 and 24).

Since the value $e_{cm}$ is within a fixed range, the control range is constant resulting in a desired control range which is fixed regardless of frequency. That is, the present invention provides a control range which is constant irrespective of the frequency and thereby avoids the possibility of an unnecessary expansion of the control range at low frequencies and the resulting erroneous operation caused by the expanded control range.

An alternative embodiment of the present invention is shown in FIG. 6 which includes input terminal 11 connected through capacitor 12 to the base of a PNP-type transistor 31, which is biased by the resistors 13 and 14. Transistor 31 has an emitter connected to power supply terminal 17 and collector grounded through a parallel circuit of a resistor 32 and a capacitor 33. The collector of transistor 31 is also connected through a series connection of a capacitor 34 and a resistor 35 to an emitter of an NPN-type transistor 36. A base of transistor 36 is connected to a voltage dividing point of resistors 37 and 38 and a collector thereof is connected to power supply terminal 17 through a resistor 39. An emitter of transistor 36 is grounded through a resistor 40. Output terminal 30 is connected to the collector of transistor 36.

A repetitive pulse, such as a flyback pulse as shown in FIG. 7A, is supplied from the horizontal output circuit 2 and is applied to the input terminal 11. During those periods of each cycle when there is no flyback pulse, transistor 31 turns ON which charges capacitor 33 resulting in voltage at the emitter of transistor 36 rising and thereby causing transistor 36 to turn OFF. During periods when transistor 36 is turned off, output terminal 30 is at a voltage level of $V_{cc}$ as shown in FIG. 7B. During that portion of each cycle when a flyback pulse occurs, transistor 31 turns OFF, allowing capacitor 33 to discharge through resistor 32. As a result, the potential at the emitter of transistor 36 gradually lowers and transistor 36 turns ON resulting in the output voltage at output terminal 30 gradually lowering to ground potential. When the period of the flyback pulse terminates, once again transistors 31 turns ON, charging capacitor 33 immediately, turning transistor 36 OFF and charging the voltage at output terminal 30 to $V_{cc}$. That is, a signal is produced having a magnitude of $V_{cc}$ when the flyback pulse is absent and gradually lowering to ground potential during the flyback pulse period.

Thus the comparison signal, $e_{cm}$, magnitude is restricted to a range between $V_{cc}$ and ground potential and thereby provides a desired control range regardless of the frequency. More particularly, in either embodiment the present invention provides a predetermined control range.

The present invention, as described heretofore has used the downward sloping portion of the comparison signal during phase comparison with a reference signal. However, the present invention can be applied as well to circuitry which provides a comparison signal having a rising slope portion during flyback pulse periods wherein control signal $e_{cm}$ is selected from the rising slope portion.

Although illustrative embodiments of this invention have been described in detail herein with reference to the accompanying drawings, it is to be understood that the invention is not limited to those precise embodiments, and that various changes and modifications may be effected therein by one skilled in the art without departing from the spirit and scope of the invention, as defined in the appended claims.

We claim as our invention:

1. An automatic frequency control signal generating circuit, comprising:

an oscillating circuit for generating repetitive pulses;

means for receiving said repetitive pulses and generating comparison signals having sloped portions and maximum and minimum levels in response to said repetitive pulses;

a source of reference signals;

phase comparison means having a first input terminal supplied with said comparison signals, a second input terminal supplied with said reference signals and an output terminal for supplying automatic frequency control signals to said oscillating circuit for controlling its frequency within a control range; and limiting means connected between said comparison signal generating means and said phase comparison means for limiting said maximum level and said minimum level of said comparison signals to first and second predetermined levels respectively, thereby limiting said control range of said automatic frequency control signal generating circuit to a predetermined range.

2. An automatic frequency control signal generating circuit according to claim 1; wherein said comparison signal generating means comprises integrating means for generating saw-tooth wave signals as said comparison signals in response to said repetitive pulses.

3. An automatic frequency control signal generating circuit according to claim 1; wherein said limiting means comprises a series circuit including sources of first and second reference potentials, first and second diodes connected together and respectively connected to said first reference potential and said second reference potential, the connecting point of said first and second diodes being connected to an output terminal of said comparison signal generating means.

4. An automatic frequency control signal generating circuit for a television receiver, comprising;

a source of reference signals;

an oscillator for generating control pulses;

an output circuit for producing repetitive pulses in response to said control pulses;

an integrating circuit for generating saw-tooth wave signals having maximum and miniumum levels in response to said repetitive pulses from said output circuit;

a phase comparator for comparing the phase of said saw-tooth waves and the phase of said reference signals, and supplying output signals to said oscillator as automatic frequency control signals; and an amplitude limiting circuit connected between said integrating circuit and said phase comparator, for limiting said maximum and minimum levels of said saw-tooth wave signals to first and second predetermined levels.

* * * * *